(12) United States Patent
Goto et al.

(10) Patent No.: US 6,178,095 B1
(45) Date of Patent: Jan. 23, 2001

(54) STRUCTURE FOR FIXING AN ELEMENT TO A PRINTED WIRING BOARD, AND ELECTRONIC EQUIPMENT HAVING THE STRUCTURE

(75) Inventors: Katsuichi Goto; Taiji Mizunaga; Yukiya Kojima; Sonomasa Kobayashi; Takumi Kishi, all of Kawasaki (JP)

(73) Assignee: Fujitsu Limited, Kawasaki (JP)

( * ) Notice: Under 35 U.S.C. 154(b), the term of this patent shall be extended for 0 days.

(21) Appl. No.: 09/124,232

(22) Filed: Jul. 29, 1998

(30) Foreign Application Priority Data

Jan. 29, 1998 (JP) .................................................. 10-016569

(51) Int. Cl.[7] ...................................................... H05K 7/20
(52) U.S. Cl. ........................ 361/801; 361/804; 361/813; 257/786
(58) Field of Search ..................................... 361/801, 804, 361/770, 813, 742; 439/680; 257/786

(56) References Cited

U.S. PATENT DOCUMENTS

| | | | |
|---|---|---|---|
| 4,342,068 | * 7/1982 | Kling ..................................... | 361/813 |
| 5,008,777 | 4/1991 | Burns ..................................... | 361/804 |
| 5,715,141 | * 2/1998 | Karlsson ............................... | 361/707 |
| 5,748,451 | * 5/1998 | Thompson et al. .................. | 361/788 |
| 5,903,439 | * 5/1999 | Tamarkin .............................. | 361/742 |

FOREIGN PATENT DOCUMENTS

| | | |
|---|---|---|
| GM 1 888 252 | 12/1963 | (DE) . |
| 62-5696 | 1/1987 | (JP) . |
| 1-107187 | 7/1989 | (JP) . |
| 5-21483 | 3/1993 | (JP) . |

* cited by examiner

*Primary Examiner*—Leo P. Picard
*Assistant Examiner*—Hung Van Duong
(74) *Attorney, Agent, or Firm*—Staas & Halsey LLP

(57) ABSTRACT

The present invention relates to a structure for fixing an element to a printed wiring board. The fixing structure includes a spacer, the printed wiring board, and a sealant. The spacer has a first end to which the element is to be fixed and a second end to be fixed to the printed wiring board. The printed wiring board has a hole having a shape determined in relation to the shape of the second end of the spacer. The sealant is filled in the hole of the printed wiring board to fix the second end of the spacer to the printed wiring board. The second end of the spacer has a projection having a length smaller than the thickness of the printed wiring board and located in the hole of the printed wiring board. With this configuration, the projection of the spacer or the sealant is prevented from projecting from a first surface of the printed wiring board opposite to its second surface for fixing the spacer, so that electronic equipment adopting this fixing structure can be reduced in size (in thickness) and a component mounting area of the first surface of the printed wiring board can be increased.

11 Claims, 4 Drawing Sheets

STRUCTURE FOR FIXING AN ELEMENT TO A PRINTED WIRING BOARD, AND ELECTRONIC EQUIPMENT HAVING THE STRUCTURE

BACKGROUND OF THE INVENTION

1. Field of the Invention

The present invention relates to a structure for fixing an element (e.g., an auxiliary printed wiring board unit for updating of software or hardware) to a printed wiring board, and also to electronic equipment (e.g., a portable information processing device) having the fixing structure.

2. Description of the Related Art

In electronic equipment such as a portable information processing device, an auxiliary printed wiring board unit is independently provided on a printed wiring board in some case, so as to increase a mounting area per unit volume. In general, electronic components including IC chips are mounted on both surfaces of each of the printed wiring board and the auxiliary printed wiring board unit. Accordingly, in the case of providing the auxiliary printed wiring board unit on the printed wiring board, a spacer is interposed between the printed wiring board and the auxiliary printed wiring board unit to fix the auxiliary printed wiring board unit onto the printed wiring board. That is, the spacer has a first end fixed to the auxiliary printed wiring board unit and a second end fixed to the printed wiring board, thereby fixing the auxiliary printed wiring board unit to the printed wiring board with a predetermined space defined therebetween.

To fix the second end of the spacer to the printed wiring board, the printed wiring board is formed with a hole so designed as to be fitted with the shape of the spacer, for example. The second end of the spacer has a projection adapted to be inserted into the hole of the printed wiring board. By filling the hole with a sealant such as a solder in the condition that the projection is inserted in the hole, the second end of the spacer is fixed to the printed wiring board. The auxiliary printed wiring board unit is fixed to the first end of the spacer by means of a screw, for example, in consideration of replacement of the auxiliary printed wiring board unit.

The length of the projection formed at the second end of the spacer is set sufficiently larger than the thickness of the printed wiring board. As a result, when the spacer is fixed to the printed wiring board, the projection of the second end of the spacer inserted in the hole of the printed wiring board largely projects from a first surface of the printed wiring board opposite to its second surface for fixing the spacer, causing a difficulty of reducing the size (especially, thickness) of electronic equipment.

Further, since the projection of the second end of the spacer projects from the printed wiring board, an electronic component cannot be mounted on a portion of the printed wiring board around the hole, causing a limitation to an increase in mounting area of the printed wiring board.

SUMMARY OF THE INVENTION

It is therefore an object of the present invention to provide a structure for fixing an element to a printed wiring board fit for a reduction in size of electronic equipment and also provide such electronic equipment having the fixing structure.

It is another object of the present invention to provide a structure for fixing an element to a printed wiring board fit for an increase in mounting area of the printed wiring board and also provide such electronic equipment having the fixing structure.

Other objects of the present invention will become apparent from the following description.

In accordance with an aspect of the present invention, there is provided a structure for fixing an element to a printed wiring board. The fixing structure includes a spacer, the printed wiring board, and a sealant. The spacer has a first end to which the element is to be fixed and a second end to be fixed to the printed wiring board. The printed wiring board has a hole having a shape determined in relation to the shape of the second end of the spacer. The sealant is filled in the hole of the printed wiring board to fix the second end of the spacer to the printed wiring board. The second end of the spacer has a projection having a length smaller than the thickness of the printed wiring board and located in the hole of the printed wiring board.

With this configuration, the length of the projection of the second end of the spacer is set smaller than the thickness of the printed wiring board, and the sealant is filled in the hole of the printed wiring board. Accordingly, the projection of the spacer or the sealant is prevented from projecting from a first surface of the printed wiring board opposite to its second surface for fixing the spacer, so that electronic equipment adopting this fixing structure can be reduced in size (in thickness) and a component mounting area of the first surface of the printed wiring board can be increased.

Preferably, the spacer has a flange contacting a part of a surface of the printed wiring board opposed to the element, the part surrounding the hole of the printed wiring board. In this case, a portion of the spacer interposed between the printed wiring board and the element except the flange can be reduced in size, so that in the case that the element is an auxiliary printed wiring board unit, a mounting area of the auxiliary printed wiring board unit can be increased.

Preferably, the hole of the printed wiring board is composed of a cylindrical portion and a radially recessed portion extending from the cylindrical portion along both surfaces of the printed wiring board, and the projection of the spacer is composed of a cylindrical portion adapted to be inserted into the cylindrical portion of the hole and a radially projected portion adapted to be inserted into the radially recessed portion of the hole. In the case that the element is fixed to the first end of the spacer by means of a screw, for example, a torque for tightening the screw or loosening the screw is applied to the spacer. However, by forming the above-mentioned radially projected portion on the projection of the spacer, the resistance of the spacer against the torque applied to the spacer can be increased to thereby provide a firm fixing structure.

In accordance with another aspect of the present invention, there is provided an electronic equipment including a housing and a printed wiring board provided in the housing. An element is fixed to the printed wiring board in accordance with the present invention.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Some preferred embodiments of the present invention will now be described with reference to the attached drawings.

Figure 1:
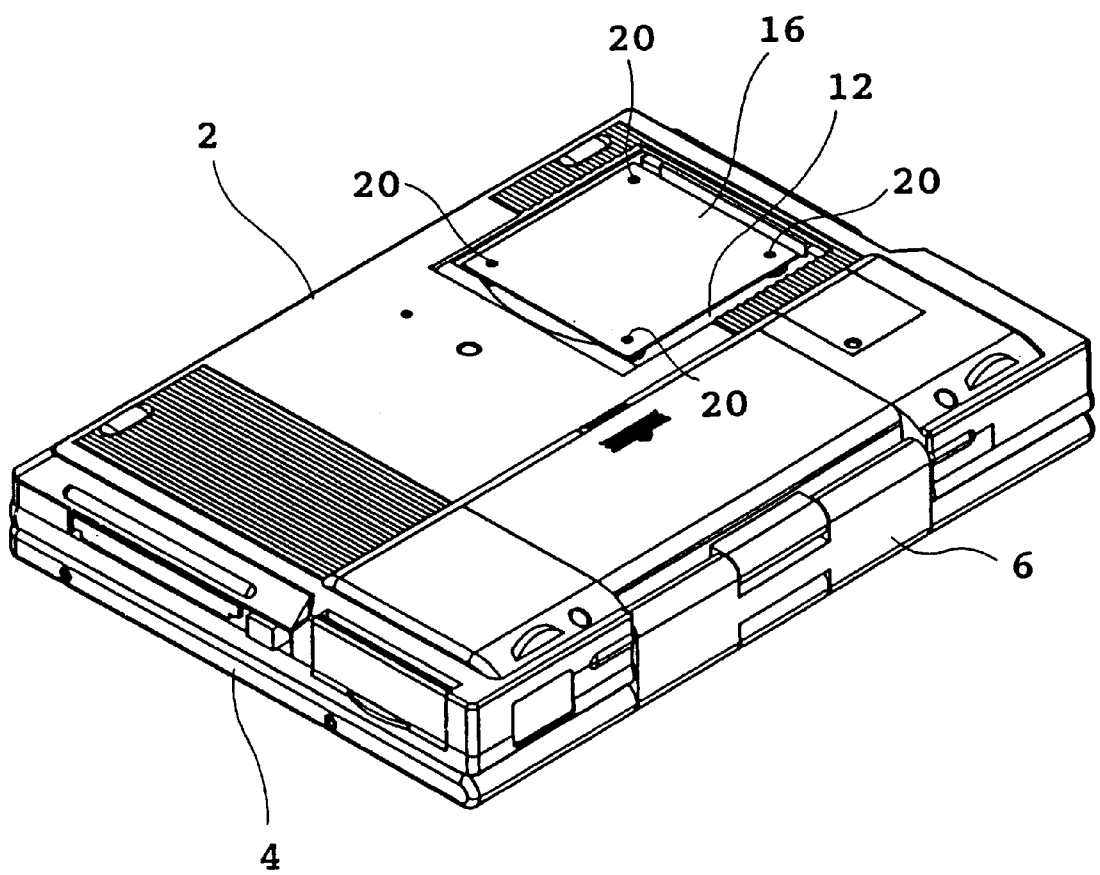
FIG. 1 is a perspective view showing a preferred embodiment of the electronic equipment according to the present invention.

Referring to FIG. 1, there is shown a preferred embodiment of the electronic equipment according to the present invention. More specifically, FIG. 1 is a perspective view of a portable information processing device as the electronic equipment according to the present invention as viewed from the back side thereof. This electronic equipment has a main housing 2 and an auxiliary housing 4. The auxiliary housing 4 is connected to the main housing 2 by a connecting member 6 so that the auxiliary housing 4 is pivotable through the connecting member 6 with respect to the main housing 2. In the condition shown in FIG. 1, the auxiliary housing 4 is closed with respect to the main housing 2. For example, the main housing 2 and the auxiliary housing 4 have an input keyboard unit and a display unit (both not shown in FIG. 1), respectively, which are opposed to each other in this condition.

Figure 2:
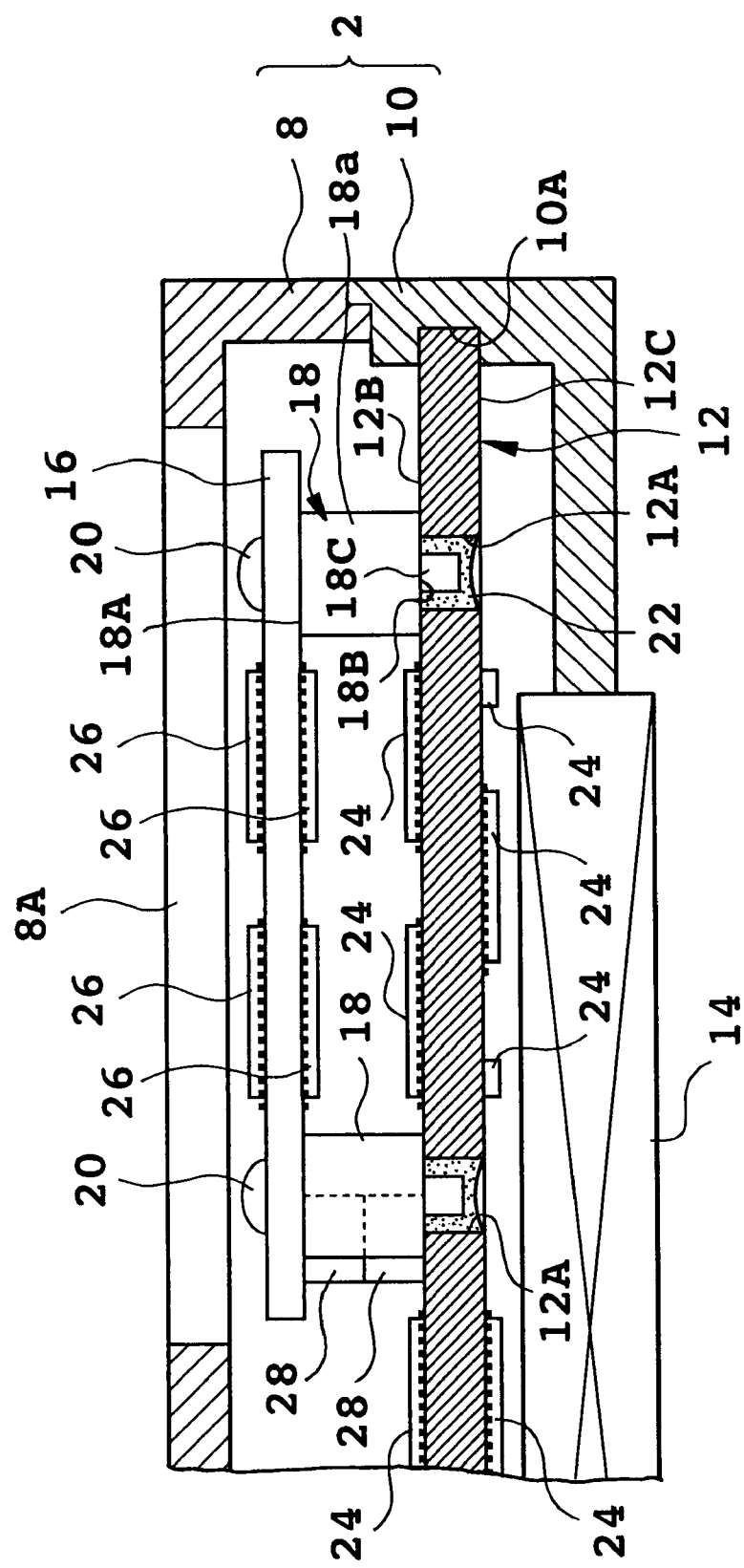
FIG. 2 is a sectional view showing a preferred embodiment of the fixing structure applied to the electronic equipment shown in FIG. 1.

FIG. 2 is a sectional view showing a preferred embodiment of the fixing structure applied to the electronic equipment shown in FIG. 1. The main housing 2 is composed of a first case member 8 and a second case member 10, thereby defining an internal space of the main housing 2. A printed wiring board 12 as a mother board is provided in the internal space of the main housing 2. The printed wiring board 12 is engaged at its end portion with a recess 10A of the second case member 10, thereby being fixed to the main housing 2. Reference numeral 14 denotes the input keyboard unit supported to the second case member 10.

A substantially rectangular auxiliary printed wiring board unit 16 as the element to be fixed in the present invention is fixed to the printed wiring board 12 by four spacers 18 provided at the four corners of the auxiliary printed wiring board unit 16. The auxiliary printed wiring board unit 16 is detachably mounted on a first end 18A of each spacer 18 by means of a screw 20. The printed wiring board 12 is formed with four through holes 12A corresponding to the four spacers 18. In the case that a body portion 18a of each spacer 18 is substantially cylindrical, each through hole 12A is so formed as to have a diameter smaller than the diameter of the body portion 18a of the corresponding spacer 18. A second end 18B of each spacer 18 has a projection 18C having a length smaller than the thickness of the printed wiring board 12 and located in the corresponding through hole 12A.

Each through hole 12A is filled with a sealant 22 in the condition where the second end 18B of the corresponding spacer 18 is in close contact with a first surface 12B of the printed wiring board 12 and a projection 18C of the corresponding spacer 18 is located in the through hole 12A, thereby fixing the second end 18B of each spacer 18 to the printed wiring board 12. In this condition, the projection 18C of each spacer 18 does not project from a second surface 12C of the printed wiring board 12 because the length of the projection 18C is smaller than the thickness of the printed wiring board 12. Further, by setting the amount of the sealant 22 to a proper amount, there is no possibility that the sealant 22 may project from the second surface 12C of the printed wiring board 12, because the exposed surface of the sealant 22 is recessed into the corresponding through hole 12A upon hardening of the sealant 22.

A solder may be used as the sealant 22. In this case, each spacer 18 is formed of a metal having good solderability, or the second end 18B and the projection 18C of each spacer 18 are coated with a metal having good solderability. Further, the inner surface of each hole 12A of the printed wiring board 12 is also coated with a metal having good solderability. By using a solder as the sealant 22, the work of fixing the second end 18B of each spacer 18 to the printed wiring board 12 can be included in the manufacturing process for the printed wiring board 12, thereby facilitating the manufacture of the electronic equipment.

A plurality of electronic circuit components 24 including an IC chip are mounted on each of the first surface 12B and the second surface 12C of the printed wiring board 12. Similarly, a plurality of electronic circuit components 26 including an IC chip are mounted on each of both surfaces of the auxiliary printed wiring board unit 16. In this preferred embodiment, there is defined a space for presence of the electronic circuit components 24 and 26 because the auxiliary printed wiring board unit 16 is fixed to the printed wiring board 12 by using the spacers 18. By setting the height of each spacer 18, i.e., the distance between the printed wiring board 12 and the auxiliary printed wiring board unit 16 to a proper amount, good radiation from the electronic circuit components 24 and 26 can be ensured.

Particularly in this preferred embodiment, a pair of connectors 28 for electrically connecting the printed wiring board 12 and the auxiliary printed wiring board unit 16 are provided. One of the pair of connectors 28 is mounted on the printed wiring board 12, and the other connector 28 is mounted on the auxiliary printed wiring board unit 16. An opening 8A slightly larger in size than the auxiliary printed wiring board unit 16 is formed through a portion of the first case member 8 corresponding to the auxiliary printed wiring board unit 16, and a lid (not shown) is detachably mounted on the first case member 8 so as to normally cover the opening 8A.

According to this preferred embodiment, the auxiliary printed wiring board unit 16 can be easily replaced with a new one by removing the lid covering the opening 8A when updating software or hardware. More specifically, the replacement of the auxiliary printed wiring board unit 16 is carried out by first removing the four screws 20, next disconnecting the pair of connectors 28, followed by removing the old auxiliary printed wiring board unit 16 to be replaced from this electronic equipment, thereafter placing a new auxiliary printed wiring board unit 16 on the spacers 18 with its connector 28 being connected to the connector 28 of the printed wiring board 12, and finally tightening the screws 20 into the spacers 18 to thereby fix the new auxiliary printed wiring board unit 16 to the first end 18A of each spacer 18.

In this manner, the auxiliary printed wiring board unit 16 is fixed to the spacers 18 by the screws 20, and the pair of connectors 28 are used to electrically connect the auxiliary printed wiring board unit 16 and the printed wiring board 12, thereby facilitating the replacement of the auxiliary printed wiring board unit 16. A fixing strength of each spacer 18 to the printed wiring board 12 against the torque applied to each screw 20 can be increased by a specific preferred embodiment to be hereinafter described.

According to the preferred embodiment shown in FIG. 2, the projection 18C of each spacer 18 and the sealant 22 do not project from the second surface 12C of the printed wiring board 12, thereby allowing a reduction in size (especially, thickness) of the electronic equipment. Further, since the projection 18C and the sealant 22 do not project from the second surface 12C of the printed wiring board 12, a portion of the second surface 12C corresponding to each hole 12A can be utilized as a mounting space for the electronic circuit components 24, thereby increasing a mounting area of the printed wiring board 12.

Figure 3:
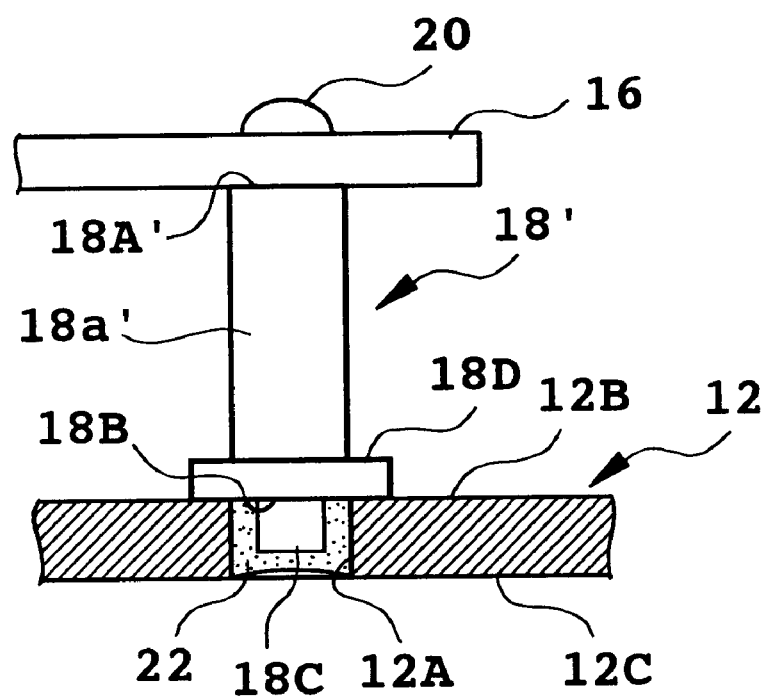
FIG. 3 is a sectional view showing another preferred embodiment of the fixing structure applicable to the electronic equipment shown in FIG. 1.

FIG. 3 is a sectional view showing another preferred embodiment of the fixing structure applicable to the electronic equipment shown in FIG. 1. In this preferred embodiment, each spacer 18 shown in FIG. 2 is replaced by a spacer 18' having a flange 18D contacting a portion of the first surface 12B of the printed wiring board 12 around the corresponding through hole 12A of the printed wiring board 12. That is, the diameter of a body portion 18a' (first end 18A') of the spacer 18' is slightly larger than the diameter of the projection 18C, and the diameter of the flange 18D is larger than the diameter of the hole 12A.

According to this preferred embodiment, the diameter of the first end 18A' of the spacer 18' can be made smaller than the diameter of the first end 18A of the spacer 18 shown in FIG. 2. As a result, a mounting area for the electronic circuit components 26 (see FIG. 2) on one surface of the auxiliary printed wiring board unit 16 on the spacer 18' side can be increased.

Figure 4A:
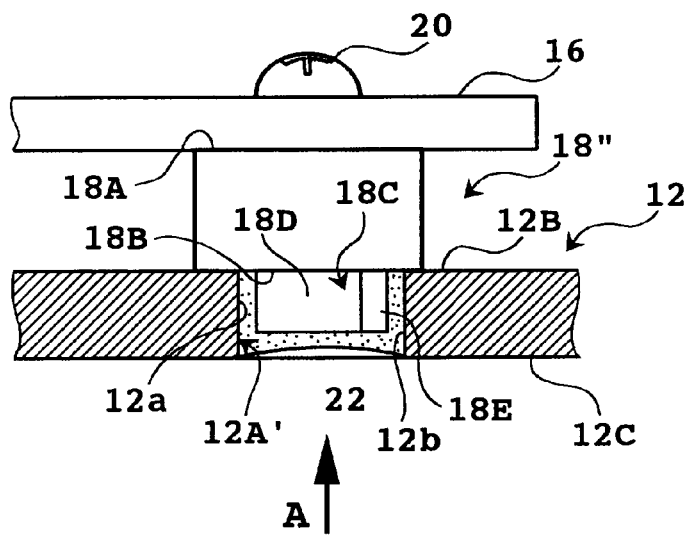
FIG. 4A is a sectional view showing a further preferred embodiment of the fixing structure applicable to the electronic equipment shown in FIG. 1.
Figure 4B:
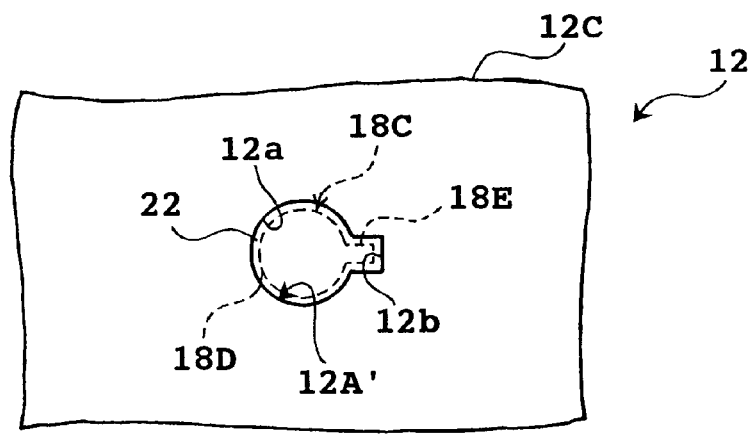
FIG. 4B is a view taken in the direction of an arrow A in FIG. 4A.

FIG. 4A is a sectional view showing a further preferred embodiment of the fixing structure applicable to the electronic equipment shown in FIG. 1, and FIG. 4B is a view taken in the direction of an arrow A in FIG. 4A. In this preferred embodiment, each through hole 12A shown in FIG. 2 is replaced by a through hole 12A' which has a cylindrical portion 12a and a radially recessed portion 12b extending from the cylindrical portion 12a along the surfaces 12B and 12C of the printed wiring board 12, and each spacer 18 shown in FIG. 2 is also replaced by a spacer 18" adapted to the through hole 12A'. That is, the projection 18C projecting into the hole 12A' from the second end 18B of the spacer 18" is composed of a cylindrical portion 18D adapted to be inserted into the cylindrical portion 12a of the hole 12A' and a radially projected portion 18E adapted to be inserted into the radially recessed portion 12b of the hole 12A'.

In the preferred embodiment shown in FIG. 2, the resistance of each spacer 18 against the torque applied to the corresponding screw 20 is limited mainly by a bonding force and/or a frictional force between the spacer 18 (a part of the second end 18B and the whole surface of the projection 18C) and the sealant 22 filled in the corresponding hole 12A. Accordingly, in the case that the bonding force or the frictional force is not sufficiently large, there is a possibility that the spacer 18 may be rotated with the corresponding screw 20 when tightening or loosening the screw 20.

To the contrary, according to the preferred embodiment shown in FIGS. 4A and 4B, the radially projected portion 18E of the projection 18C of each spacer 18" is inserted in the radially recessed portion 12b of the corresponding through hole 12A'. Therefore, even when the bonding force or the frictional force between the spacer 18" and the sealant 22 filled in the corresponding hole 12A' is small, a sufficiently large resistance can be generated against the torque applied to the corresponding screw 20, thereby improving the fixing strength of each spacer 18" to the printed wiring board 12.

According to the present invention as described above, it is possible to provide a structure for fixing an element to a printed wiring board fit for a reduction in size (especially, thickness) of electronic equipment and also provide such electronic equipment having the fixing structure. Furthermore, according to the present invention, it is possible to provide a structure for fixing an element to a printed wiring board fit for an increase in mounting area of the printed wiring board and also provide electronic equipment having the fixing structure.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A structure for fixing an auxiliary printed wiring board unit having an electronic component mounted thereon, comprising:
   a spacer having a first end to which said auxiliary printed wiring board unit is to be fixed and a second end having a projection;
   a printed wiring board having a hole, two surfaces, a thickness and electronic components mounted on both surfaces thereof; and
   a sealant filled in said hole of said printed wiring board to fix said second end of said spacer to said printed wiring board;
   said projection having a length smaller than the thickness of said printed wiring board and being located in said hole of said printed wiring board; and
   said hole of said printed wiring board being large enough to define a clearance between said projection and said printed wiring board for allowing said sealant to fill in said clearance thereby firmly fixing said projection to said printed wiring board.

2. A structure according to claim 1, wherein said spacer has a flange contacting a part of a surface of said printed wiring board opposed to said element, said part surrounding said hole of said printed wiring board.

3. A structure according to claim 1, wherein:
   said hole of said printed wiring board has a cylindrical portion and a radially recessed portion extending from said cylindrical portion along both surfaces of said printed wiring board; and
   said projection of said spacer comprises a cylindrical portion adapted to be inserted into said cylindrical portion of said hole and a radially projected portion adapted to be inserted into said radially recessed portion of said hole.

4. A structure according to claim 1, further comprising a screw for fixing said element to said first end of said spacer.

5. A structure according to claim 1, wherein:
   said auxiliary printed wiring board unit has an IC chip;
   said spacer comprises a plurality of spacers; and
   said auxiliary printed wiring board unit is fixed to said plurality of spacers by screws.

6. A structure according to claim 1, further comprising a connector for electrically connecting said printed wiring board and said auxiliary printed wiring board unit.

7. A structure according to claim 1, wherein said sealant is a solder.

8. A structure according to claim 1, wherein said spacer has a flange contacting a part of a surface of said printed wiring board opposed to said auxiliary printed wiring board unit, said part surrounding said hole of said printed wiring board.

9. A structure according to claim 1, wherein:

said hole of said printed wiring board has a cylindrical portion and a radially recessed portion extending from said cylindrical portion along both surfaces of said printed wiring board; and said projection of said spacer comprises a cylindrical portion adapted to be inserted into said cylindrical portion of said hole and a radially projected portion adapted to be inserted into said radially recessed portion of said hole.

10. Electronic equipment comprising:

a housing;

a printed wiring board provided in said housing, said printed wiring board having two opposing surfaces, a thickness, a hole and electronic components mounted on both opposing surfaces;

an auxiliary printed wiring board unit having an electronic component mounted thereon;

a spacer provided between said printed wiring board and said auxiliary printed wiring board unit, said spacer having a first end to which said auxiliary printed wiring board unit is to be fixed and a second end having a projection to be fixed to said printed wiring board; and a sealant filled in said hole of said printed wiring board to fix said projection to said printed wiring board;

said projection having a length smaller than the thickness of said printed wiring board and being located in said hole; and said hole being large enough to define a clearance between said projection and said printed wiring board for allowing said sealant to fill in said clearance thereby firmly fixing said projection to said printed wiring board.

11. Electronic equipment according to claim 10, wherein said housing has an opening at a position corresponding to said auxiliary printed wiring board unit for allowing replacement of said auxiliary printed wiring board unit with a new one.

* * * * *